(12) United States Patent
Kondrus et al.

(10) Patent No.: US 11,690,181 B2
(45) Date of Patent: Jun. 27, 2023

(54) FLAMEPROOF HOUSING

(71) Applicant: R. STAHL SCHALTGERÄTE GMBH, Waldenburg (DE)

(72) Inventors: Elena Kondrus, Künzelsau (DE); Jürgen Schmitt, Öhringen (DE); Natascha Sekinger, Baierbach (DE); Otto Walch, Gerabronn (DE); Christian Kochendörfer, Schwäbisch Hall (DE); Bernd Limbacher, Schwäbisch Hall (DE)

(73) Assignee: R. STAHL SCHALTGERÄTE GMBH, Waldenburg (DE)

( * ) Notice: Subject to any disclaimer, the term of this patent is extended or adjusted under 35 U.S.C. 154(b) by 68 days.

(21) Appl. No.: 16/972,294

(22) PCT Filed: Jun. 4, 2019

(86) PCT No.: PCT/EP2019/064438
§ 371 (c)(1),
(2) Date: Dec. 4, 2020

(87) PCT Pub. No.: WO2019/233986
PCT Pub. Date: Dec. 12, 2019

(65) Prior Publication Data
US 2021/0120682 A1    Apr. 22, 2021

(30) Foreign Application Priority Data
Jun. 5, 2018 (EP) .................................... 18175982

(51) Int. Cl.
*H05K 5/00* (2006.01)
*H05K 5/03* (2006.01)
*H05K 5/06* (2006.01)

(52) U.S. Cl.
CPC ............. *H05K 5/0013* (2013.01); *H05K 5/03* (2013.01); *H05K 5/069* (2013.01)

(58) Field of Classification Search
CPC ......... H05K 5/069; H05K 5/03; H05K 5/0013
See application file for complete search history.

(56) References Cited

U.S. PATENT DOCUMENTS 3,974,933 A * 8/1976 Toth ...................... E05B 65/006
220/88.1
4,032,233 A * 6/1977 Oscarsson .............. G03B 27/20
355/91

(Continued)

FOREIGN PATENT DOCUMENTS

| CN | 102791168 A | 11/2012 |
|---|---|---|
| CN | 102832579 A | 12/2012 |

(Continued)

OTHER PUBLICATIONS

English Translation to International Search Report for International Application No. PCT/EP2019/064438.

(Continued)

*Primary Examiner* — Rockshana D Chowdhury
*Assistant Examiner* — Douglas R Burtner
(74) *Attorney, Agent, or Firm* — Cantor Colburn LLP

(57) ABSTRACT

A housing according of the flameproof encapsulation protection type having a housing body which has an opening closed by a cover. The opening is surrounded by a flange which is directed outward away from the housing body. The edge of the cover lies flat on the flange. The edge and the flange are both preferably continuous. In any case, the edge and the flange do not have any passage openings for clamping means. In order to clamp the edge against the flange, clamps are provided which hold the edge and the flange pressed against each other in the manner of screw clamps. The clamps are provided with releasable clamping means (Continued)

and are preferably captively retained on the housing body or the cover, the clamps being movable between a closed position, in which the cover is fixedly clamped, and an open position, in which the clamps do not extend over the cover and allow the cover to be opened unhindered.

20 Claims, 5 Drawing Sheets

(56) References Cited

U.S. PATENT DOCUMENTS

| | | | |
|---|---|---|---|
| 4,157,146 A | 6/1979 | Svenson | |
| 4,180,177 A * | 12/1979 | Gunderman | H05K 5/04 220/88.1 |
| 4,469,238 A | 9/1984 | Ranalli | |
| 4,664,281 A | 5/1987 | Falk et al. | |
| 4,796,159 A * | 1/1989 | Miksche | H05K 7/1454 361/796 |
| 4,922,056 A | 5/1990 | Larsson | |
| 5,017,051 A * | 5/1991 | Kowalik | E21D 23/146 299/1.6 |
| 5,136,760 A * | 8/1992 | Sano | F16B 5/0635 24/457 |
| 5,472,353 A * | 12/1995 | Hristake | H05K 7/20545 361/709 |
| 6,101,732 A | 8/2000 | Roy et al. | |
| 6,753,473 B2 * | 6/2004 | Barlian | H05K 5/063 174/520 |
| 10,680,417 B2 | 6/2020 | Baumer | |
| 11,121,484 B2 * | 9/2021 | Ash | F16B 7/187 |
| 2001/0006111 A1 | 7/2001 | Barlian et al. | |
| 2002/0063111 A1 | 5/2002 | Nishitani | |
| 2003/0116571 A1 | 6/2003 | Sulzbach et al. | |
| 2004/0061268 A1 | 4/2004 | Sawdon | |
| 2007/0205012 A1 * | 9/2007 | Stachowiak | H05K 5/0221 174/58 |
| 2009/0154072 A1 * | 6/2009 | Stachowiak, Jr. | H05K 5/00 361/659 |
| 2009/0201633 A1 * | 8/2009 | Stachowiak, Jr. | H02B 1/00 361/672 |
| 2014/0063696 A1 * | 3/2014 | Todd, II | G01R 11/04 361/672 |
| 2014/0076901 A1 * | 3/2014 | Manahan | B65D 43/26 292/257 |
| 2022/0201872 A1 * | 6/2022 | Kondrus | H05K 5/0008 |

FOREIGN PATENT DOCUMENTS

| | | | | |
|---|---|---|---|---|
| CN | 204203305 U | 3/2015 | | |
| CN | 205553983 U | 9/2016 | | |
| CN | 206734130 U | 12/2017 | | |
| CN | 107851975 A | 3/2018 | | |
| DE | 112010005085 T5 | 11/2012 | | |
| EP | 1107656 A2 | 6/2001 | | |
| EP | 3579671 A1 * | 12/2019 | | H02B 1/28 |
| SU | 902337 A1 | 1/1982 | | |
| WO | 2011084152 A1 | 7/2011 | | |
| WO | 2019233986 A1 | 12/2019 | | |

OTHER PUBLICATIONS

International Search Report for International Application No. PCT/EP2019/064438.
Written Opinion for International Application No. PCT/EP2019/064438.
European Search Report for Application No. EP 18 17 5982.
CN Office Action for Application No. 201980037433.5; dated Aug. 25, 2021.
Chinese Office Action for Chinese Application No. 201980037433.5 dated Apr. 12, 2022; 8 Pages.
Second Chinese Office Action for Chinese Application No. 201980037433.5 dated Apr. 12, 2022; 8 Pages.
Translation of Second Chinese Office Action for Chinese Application No. 201980037433.5 dated Apr. 12, 2022; 10 Pages.
Russian Office Action for Application No. 2020142004/07(078081); dated Sep. 21, 2022 (No English Translation).
Decision to Grant dated Feb. 16, 2023; EP Application No. 18175982.0; 1 page (non-English).
Grant Decision issued Mar. 2, 2023; RU Application No. 2020142004/07; 9 pages (non-English).

\* cited by examiner

FLAMEPROOF HOUSING

CROSS REFERENCE TO RELATED APPLICATIONS

This application is a National Stage of PCT Application No. PCT/EP2019/064438 filed on Jun. 4, 2019, which claims priority to European Patent Application No. 18175982.0 filed on Jun. 5, 2018, the contents each of which are incorporated herein by reference thereto.

TECHNICAL FIELD

The invention refers to a housing in the protection type flameproof enclosure for housing of electric or electronic or other components that could form ignition sources. Particularly, the invention refers to a housing of large volume, having a housing volume of multiple liters, preferably multiples of 10 liters, for use in explosive environments.

BACKGROUND

From U.S. Pat. No. 4,180,177 a housing is known having a housing body and a door provided thereon that allows access to the housing inner space, if necessary. The door is pivotably supported by means of hinges on the housing body. In order to safely close the housing opening, it is screwed with the housing body by means of bolts that are distanced from each other along its entire edge. For attaching the bolts bores are necessary along the edge of the door. In order to guarantee explosion protection, the housing needs to be configured that all gaps which lead from the housing inner space into the environment have to fall below a minimum width and have to exceed a minimum length in order that an ignited explosion in the housing inner space does not result in a propagation of the explosion outside the housing. Neither flames nor hot gases, nor glowing particles are allowed to escape through the gap formed between the door and the housing.

BRIEF SUMMARY

It is the object of the invention to improve such a housing.

A flameproof housing for housing electric or electronic components that could form ignition sources, comprising: a housing body surrounding an inner space, the housing body including an opening bordered by a flange, a cover that comprises an edge abutting against the flange, and a plurality of clamps arranged along the flange and the edge with a distance to each other, the plurality of clamps clamping the edge and against the flange in order to clamp the edge against the flange with or without a seal arranged therebetween.

The inventive housing comprises a housing body that surrounds an inner space for reception of electric or electronic components or also other elements. The housing body comprises an opening that is bordered by a flange. The flange is orientated so that it can be accessed at its backside from the outside. The opening bordered by the flange is closed with a cover, the edge of which is placed on the flange and preferably ends therewith. In order to reliably keep the edge and the flange together, a number of clamps are provided that are arranged along the flange and the edge with distance to each other, wherein each clamp clasps the edge and the flange and in the closed condition clamps the edge against the flange with or without sealing arranged therebetween.

According to this concept, a good accessibility of the inner space is achieved. The flange orientated to the outward does not reduce the clearance dimension of the opening such that unimpeded access to the inner space is ensured.

In addition, the number of clamps can be varied or defined in a simple manner without being required to make constructive or manufacturing technological modifications on the housing. An adaption to different conditions is easily possible.

The concept according to the invention avoids particularly the necessity otherwise present in the prior art to provide through-openings or holes for reception of attachment bolts. In doing so, it becomes possible to limit the width of the flange to the necessary gap length. Additional length that would else be required, in order to ensure the necessary gap length also in the area of the bolt holes are not necessary.

The concept according to the invention is particularly suitable for especially large housings, the opening of which can be larger than $\frac{1}{4}$ m$^2$, larger than $\frac{1}{2}$ m$^2$ and particularly larger than 1 m$^2$. Static redundant dimensions that could occur, particularly with large area covers at a multiplicity of attachment bolts, are avoided reliably. The clamps attached to the edge clamp the edge of the cover reliably against the flange also, if the flange and the edge of the cover have a noticeable tolerance in the positioning with regard to each other, e.g. due to temperature changes.

The flange is preferably configured as planar flange with a planar flange surface. The cover comprises an edge surface matching therewith and for example also planar edge surface that can be brought in contact with the flange surface directly or by placing a sealing in between. Preferably the edge surface and the flange surface have corresponding contours at the inner and/or outer side. The cover can be configured in a flat manner as a whole or can also comprise a bulge if this is required or desired. Basically it is, however, also possible to configure the flange surface and the edge surface of the cover matching therewith in a non-planar manner, e.g. if the opening extends along two sides of the housing.

In a preferred embodiment the cover is connected with the housing body by means of at least one hinge. It can thus be opened and closed like a flap or door. In the closed condition the clamps secure the cover on the housing. Preferably the hinges comprise a radial play, the dimension of which is sufficient in order to define the position of the closed cover on the housing body exclusively by the two-dimensional contact of the edge surface on the flange surface and thus to not impede the closing of the gap.

If required, positioning means for congruent alignment of the edge and the flange with regard to each other can be provided on the housing body and the cover. Such positioning means can be formed, for example, by one or more alignment pins that are attached on the cover or on the flange. The housing body of the cover is then provided with an alignment bore accordingly through which the alignment pin extends in the closed condition of the cover in order to secure the cover in the desired position. The positioning means can be provided at the flange surface and the edge surface or also outside thereof. Due to the congruent alignment of the flange and the cover with regard to each other, the gap therebetween is defined such that the required gap length is complied with everywhere and an ignition is avoided in this manner.

Preferably, the clamps are captively held on the housing body or on the cover alternatively. For this they can be movably held at the housing body or the cover. For example, for captive holding a clamp can be connected with the cover or the housing body by means of a limp element, such as an elastic band, a rope, a chain or a spring. It is also possible to support the clamp on the housing body or the cover pivotably about a pivot axis by means of a hinge device or if required also in a shiftable manner. The shift direction can be orientated transverse or parallel to the pivot axis. It can also be transverse or parallel to the direction of the force clamping the cover against the flange.

In case of a movable support of the clamp on the cover or the housing body, it is expedient if means are provided to keep the clamp in the open position in which it releases the cover. This facilitates the removal of the cover in that all of the clamps are kept in an open position after their release. It is also expedient, if means are provided that define the closing position of the movable clamps. Thereby assembly faults can be minimized. A respective assembler transfers the clamp into the closing position and then tightens the clamp in order to attach the cover on the flange. The means defining the closing position makes sure that the clamp takes its desired position.

Each clamp typically comprises a clamping surface and clamping means opposite this clamping surface. Independent of the arrangement and support of the clamp, all devices can serve as clamping means that neither extend through the edge of the cover, nor through the flange of the housing body. Such clamping means can be clamping screws, clamping wedges, clamping eccentrics or the like. Particularly, it can be advantageous to provide clamping means with a force limitation device, e.g. a clamping screw with a torque limitation device. With this, especially in the field of flameproof enclosures with a planar gap, the necessary closing forces at the gap can be adjusted safely. For closing the housing many clamps and thus many screws are used. By means of the force limitation device it is ensured that the cover is not able to lift too far from the flange and that the defined flameproof gap is not exceeded.

For ensuring a safe assembly, the cover screws are tightened with a predefined torque. Due to a friction clutch or another torque limitation means between the screw head and the screw shank, torque wrenches are not necessary during the assembly, start-up and in the context of service or repair operations that would be required otherwise. This increases the assembly safety. Especially in view of the large number of clamps and thus screws, the closing of the housing is simplified, because the additional application of torque wrenches and the check of the correct tightening torque becomes unnecessary.

BRIEF DESCRIPTION OF THE FIGURES

Preferred embodiments of the invention are apparent from the drawings, the description or the claims. In the drawings show:

DETAILED DESCRIPTION

Figure 1:
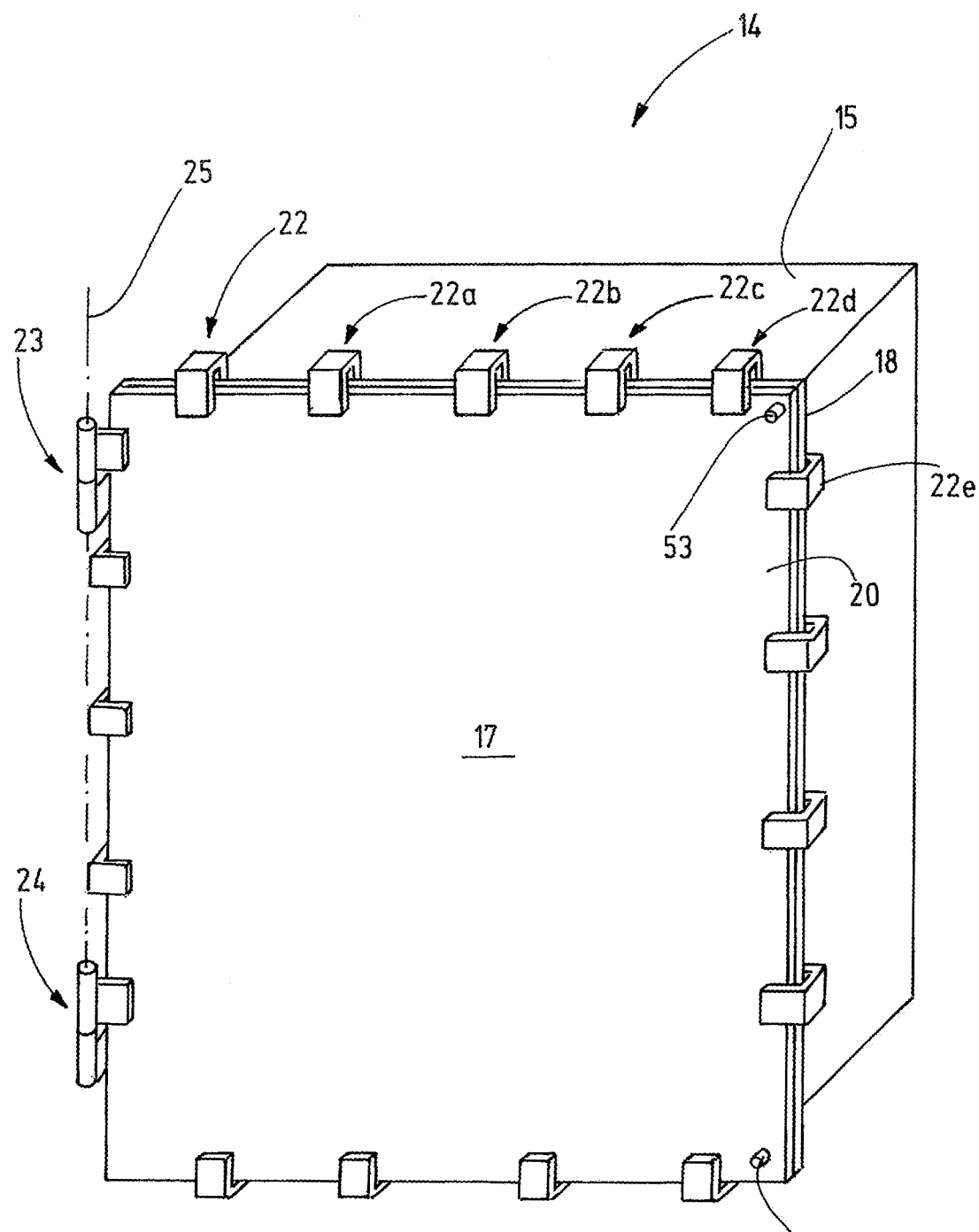
FIG. 1 a housing according to the invention in a schematic perspective illustration, FIG. 2 a clamp for attaching of the cover on the housing in a schematic side view, FIG. 3 a modified embodiment of the clamp according to FIG. 2, FIG. 4 the clamp according to FIG. 3 in a closing position in top view, FIG. 5 the clamp according to FIG. 4 in the same position, but in a partly cut illustration, FIG. 6 the clamp according to FIGS. 4 and 5 in an open position, FIG. 7 a further embodiment of a clamp enclosing position, FIG. 8 a clamp with pulling screw in closing position, FIG. 9 a clamp with toggle lever clamp in closing position, FIG. 10 a clamp with eccentric clamp in closing position, FIG. 11 a clamp with wedge clamp in closing position, FIG. 12 a clamping screw with friction clutch for force limitation.

FIG. 1 illustrates a housing 14 that is configured in the explosion protection type ex-d ("flameproof enclosure"). It comprises a housing body 15 with a housing opening 16 (see FIG. 2) that is closed by a cover 17. In the present embodiment the opening 16 has four corners and the cover 17 is accordingly rectangular or square. The invention is, however, not limited to such openings and housings. The opening can also be round, oval or polygonal and can be bordered by straight or curved edges.

The housing 15 is closed by means of the cover 17 such that it separates the housing inner space from the environment, such that no flames can escape from the inner space into the environment. For this all of the gaps provided at the housing 14 are so narrow and concurrently so long that escaping gases are cooled below an ignition temperature, i.e. flames or glowing particles cannot pass therethrough. An explosion ignited in the housing 14 remains limited to the housing inner space and does not ignite a potentially present explosive atmosphere in the housing 14. The housing is, however, not gas tight. One or more openings can be provided that are provided with so-called flame traps (pressure relief bodies). They consist of bodies that have narrow channels and/or pores and are thus gas permeable.

For attaching the cover 17 on the housing body 15, the housing body 15 comprises a flange 18 facing away from the opening 16 that extends around the opening 16. The flange 18 comprises a flange surface 19 that faces the cover 17 and that is preferably configured as planar surface. Congruent with the flange 18 the cover 17 comprises an edge 20 that abuts with an edge surface 21 against the flange surface 19. If necessary, a seal can be arranged between the edge surface 21 and the flange surface 19. Preferably, the flange surface 19 and the edge surface 21, however, abut against each other without seal. The gap formed in between comprises a length of, for example, more than 20 mm that impedes the escape of flames, wherein the gap width is preferably zero along the entire flange 18 or does not exceed a small dimension of a few 100th millimeters. The gap formed between the flange surface 19 and the edge surface 21 is, however, typically not gas tight. The gap can also be sealed by means of a seal that impedes or blocks the escape of gases. The seal is then held and compacted between the flange 18 and the edge 20. In such an embodiment the gap length can be selected shorter than without seal.

For explosion protected holding of the cover 17 on the housing body 15, clamps 22 (22a, 22b, 22c, 22d, 22e and further) are provided along the entire flange 18 and the edge 20 placed thereon that are preferably identically configured and serve to press the edge 20 against the flange 18. The following description of the clamp 22 applies accordingly for all other clamps 22a, 22b, 22c, 22d, 22e and further that are arranged along the flange 18, e.g. with equal distances to each other. Alternatively, the clamps 22a, 22b, 22c, 22d, 22e could also be arranged with unequal distances according to the load requirements.

The cover 17 can be separated from the housing body 15 or can be connected with one or more hinges 23, 24 with the housing body 15, wherein the hinges 23, 24 preferably define a common pivot axis 25. The pivot axis can be arranged at an arbitrary side of the housing. The hinges 23, 24 only serve to secure a cover 17 in the open position. The closing position of the cover 17 is effected by the clamps 22 (22a, 22b, 22c, 22d, 22e and further).

Figure 2:
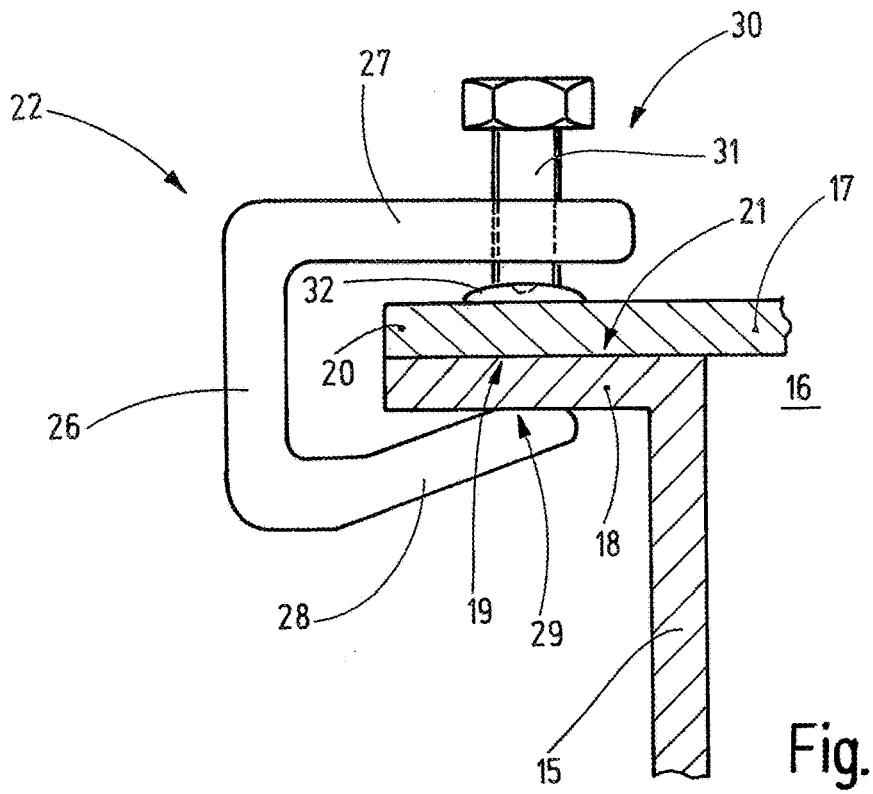

The clamp 22 is illustrated in FIG. 2 in a simple embodiment. It comprises a rigid body 26 that is approximately c-shaped or u-shaped in a side view and comprising two legs 27, 28 clasping the edge 20 and the flange 18. The two legs 27, 28 extend away from the back portion of the body 26, wherein the leg 28 extends beyond the flange 18 and the leg 27 extends above the edge 20.

A clamping surface 29 is formed on the leg 28 that abuts against the side of the flange 18 facing away from the flange surface 19. A clamping means 30 is supported on the other leg 27 that is here, as an example, configured in the form of a clamping screw 31 provided with a foot 32. This is supported on the clamping screw, preferably rotatably and if necessary also tiltably and is supported on the side of the edge 20 of the cover 17 facing away from the edge surface 21. However, the arrangement can also be realized vice versa in that the clamping surface 29 engages the cover and the clamping means 30 engages the flange.

By activation of the clamping means, e.g. by tightening of the clamping screw 31, the edge surface 21 is firmly clamped against the flange surface 19. If all of the clamps 22 on the housing 14 are tightened in this manner, the cover 17 is firmly held on the housing body 15 and closes the inner space thereof in an explosion-proof manner. The lateral distances between the clamps 22, 22a etc. are thereby selected with regard to the edge stiffness of the cover 17 and the stiffness of the flange 18 such that also a non-allowed widening of the gap between the clamps does not occur in case of an explosion in the housing inner space.

Figure 3:
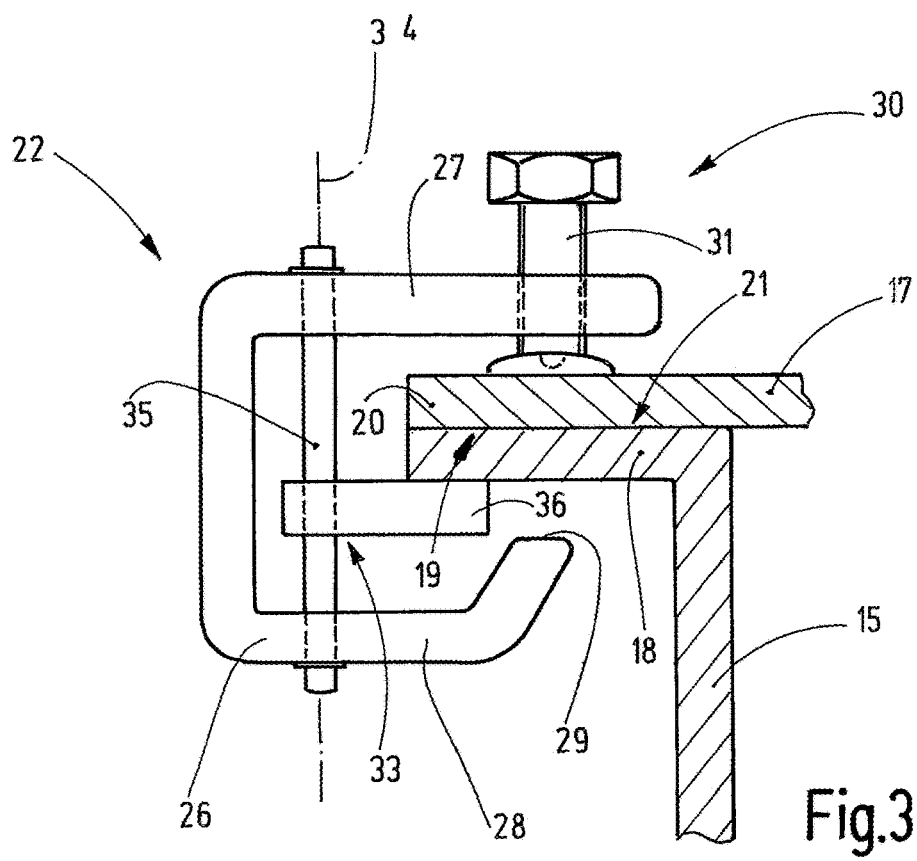

In a further configuration of the invention the clamp 22 is captively held at the housing 15, as is for example illustrated in FIG. 3. As far as this embodiment corresponds to the embodiment of the housing 15 and the clamp 22 described above, reference is made to the above description that applies accordingly on the basis of the already introduced reference signs. As supplement and in addition the following is noted:

For a captive support of the clamp 22, 22a etc. on the housing body 15 the clamp 22 is connected with the flange 18 or the housing body 15 by a hinge 33. Alternatively, the clamp 22, 22a etc. can be connected with a cover. The hinge 33 defines a hinge axis 34 that is preferably arranged outside of the flange 18 and the edge 20, particularly outside the flange surface 19 and the edge surface 21. The hinge axis 34 is defined by a pin 35 that extends in lateral distance to the flange 18 through a holder 36 that is connected with the flange 18 (or the edge 20), e.g. welded. Thereby the pin is preferably locked with both ends in the legs 27, 28 and extends preferably in an axially shiftable manner through an opening of the holder 36, whereby the clamp 22 is movable along the hinge axis 34.

Figure 5:
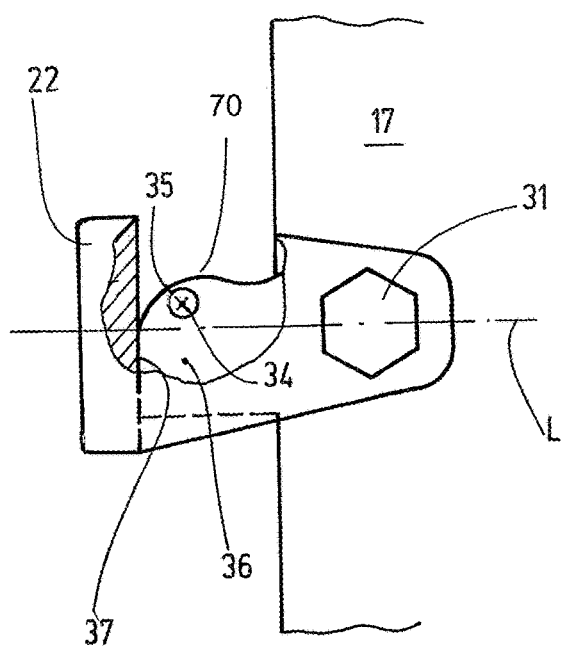
Figure 4:
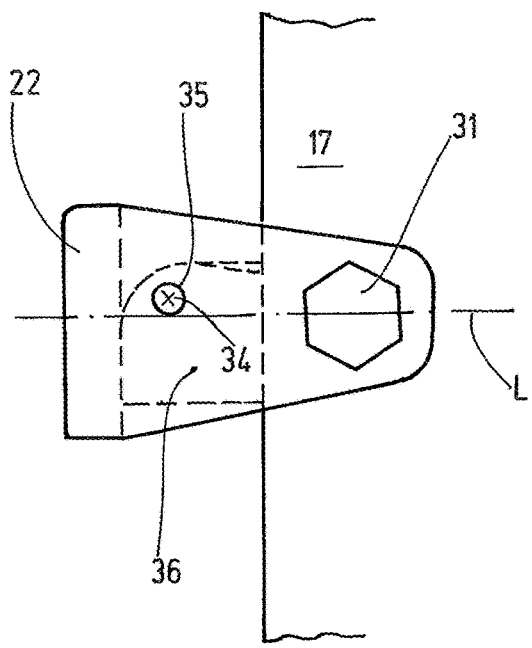
Figure 6:
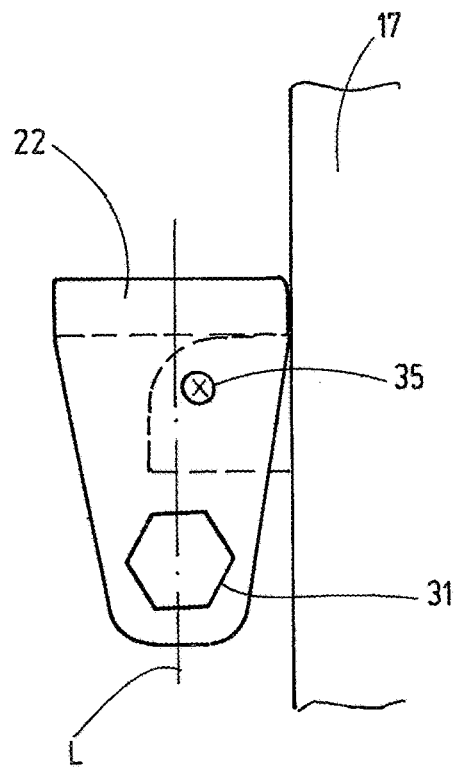

As shown in FIGS. 4, 5 and 6, the hinge axis 34 is preferably eccentrically arranged with regard to the holder 36. This means that the hinge axis 34 does not intersect a center axis L of the clamp 22 that is orientated orthogonal to the flange 18, if the clamp 22 is closed (FIGS. 4 and 5) and extends centrally through the clamping screw 31. If the clamp 22 is in open position (FIG. 6), the pin 35 is located between the center axis L and the flange 18. The clamp 22 is shiftable in direction of the hinge axis 34 and top or bottom at the end of its shifting path. The holder 36 can also be used to limit the pivot range of the clamp 22. The face of the holder 36 can be positioned such that the clamp 22 abuts against the face of the holder 36 on which an abutment surface 37 is formed in its closing position illustrated in FIGS. 4 and 5. The clamp 22 can be moved from the position illustrated in FIG. 6 in the position according to FIGS. 4 and 5 in which the straight portion of the body 26 connecting the legs 27, 28 abuts against the abutment surface 37. The clamp 22 can, however, not be pivoted beyond this position.

In addition, the holder 36 can comprise a clamping surface 70 that gets in frictional contact with the inner side of the back portion of the clamp 22, if the clamp 22 is transferred into its open position as illustrated in FIG. 6. In doing so, it is ensured that all clamps 22, 22a etc., if they are transferred in their open positions, remain therein such that the cover 17 can be removed in an unimpeded manner without being impeded by the clamps 22, 22a etc. These are positioned in the open position (FIG. 6) such that no part of the clamp 22 extends over the flange 18. In the closing position (FIGS. 4 and 5) they are, however, positioned such that the legs 27, 28 extend over the edge 20 and the flange 18.

Figure 7:
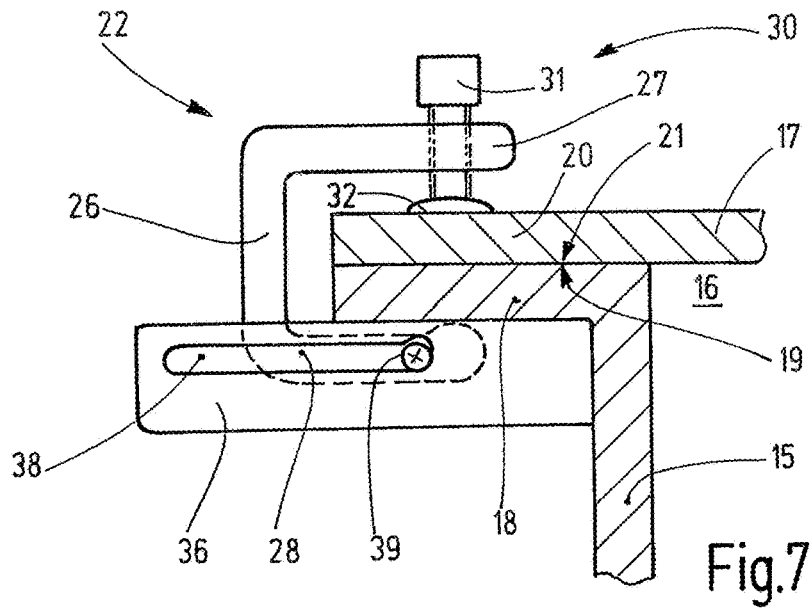

FIG. 7 illustrates a modified clamp 22 for which the description above applies accordingly based on the already introduced reference signs. Again the clamp 22 is captively held at the housing body 15 by means of a holder 36. The holder 36 can have two lugs that receive the leg 28 in between. The lugs comprise an elongated hole 38 respectively through which a pin 39 extends that is seated in the leg 28. The elongated hole 38 can be arranged substantially parallel to the flange 18 and extending away from the housing body 15.

The pin 39 supports the clamp 22 pivotably and in a shiftable manner on the flange 18. The elongated hole 38 comprises an extension directed toward the flange 18 at its inward located end at which the pin 39 is in a position at which a clamp 22 is to be tightened, so that the pin 39 can also be moved vertically at least here, i.e. can be moved toward and away from the flange 18.

By tightening the clamping means 30, the cover 17 is tightened in the closing position. If the clamping means 30 is released, the clamp 22 can be moved outwardly and/or can be flapped away from the edge 20 such that the cover 17 can be removed in an unimpeded manner.

Figure 8:
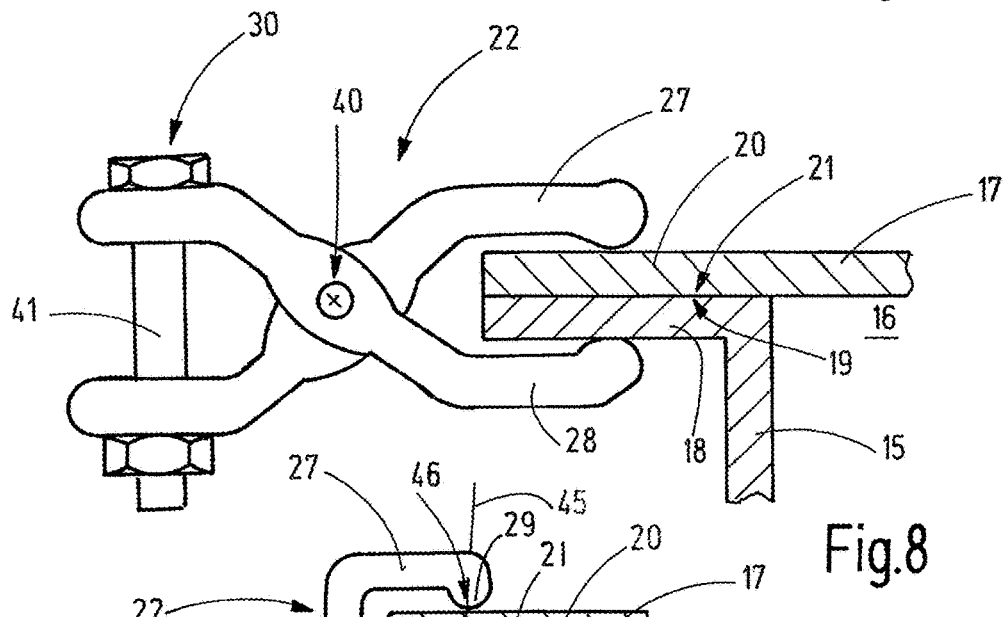

Another modified embodiment of the clamp 22 is illustrated in FIG. 8. The two legs 27, 28 are connected with each other in the type of a forceps by a hinge 40, in order to clamp the edge 20 and the flange 18 in between. The ends of the legs 27, 28 located beyond the hinge 40 with view from the flange 18 can be tightened toward each other by the clamping means 30. The clamping means 30 can be formed by a clamping screw 41, for example, that tightens the two free ends of the legs 27, 28 toward each other.

Figure 9:
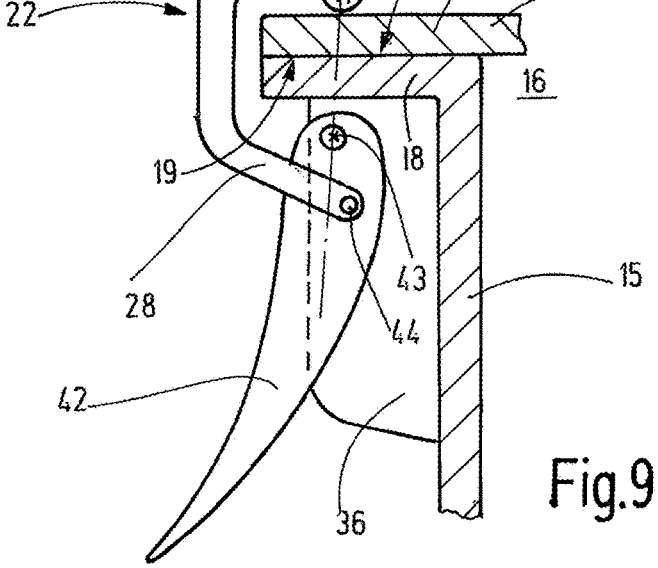

FIG. 9 illustrates another variation of the inventive clamp 22 that clamps the cover 17 with its edge 20 against the flange 18. Again the clamp 22 comprises two legs 27, 28, wherein one of the legs, e.g. leg 28, can be tightened by means of a toggle lever arrangement. For this a holder 36 can be arranged at the housing body 15 again, on which a clamping lever 42 can be pivotably supported, preferably about an axis 43 that is arranged parallel to the flange surface 19. The leg 28 is supported on the clamping lever 42 in a hinged manner, wherein the hinge axis 44 is orientated parallel to the pivot axis 42. The position of the hinge axis 44 is thereby offset from a connecting line 45 that connects a contact location 46 between the leg 27 and the edge 20 with the pivot axis 43. In the clamping position the hinge axis 44 is located between the straight connecting line 45 and the housing body 15.

Figure 10:
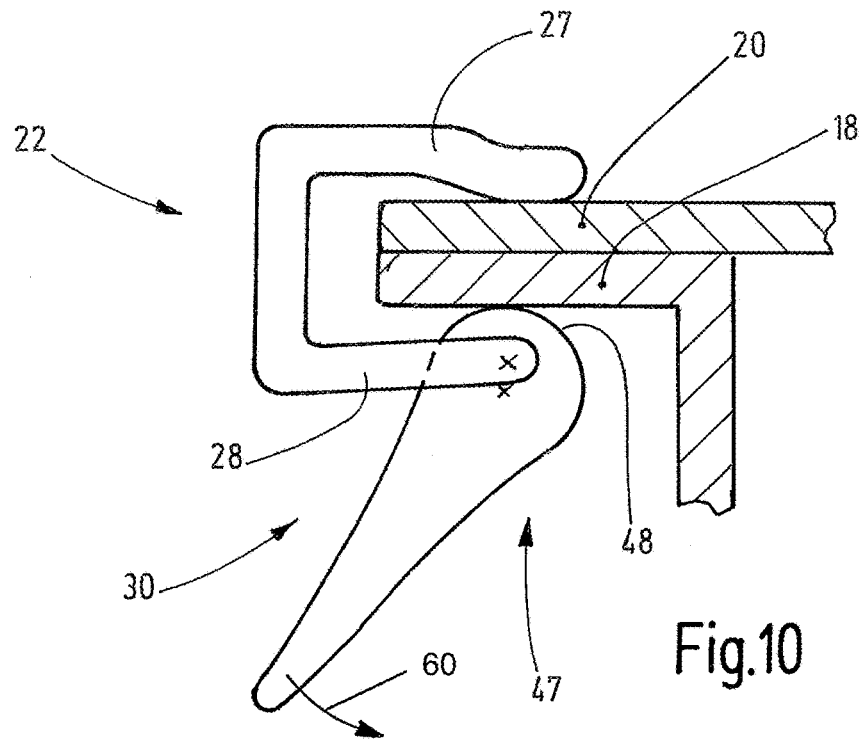

Beside the toggle lever clamping device according to FIG. 9, the clamp 22 can also be transferred into the clamping position by means of an eccentric clamping device 47 as shown in FIG. 10. The eccentric clamping device 47 comprises, for example, an eccentric lever arranged on the leg 27 or on the leg 28 having a cam surface 48 that acts on the flange 18 or the edge 20.

Figure 11:
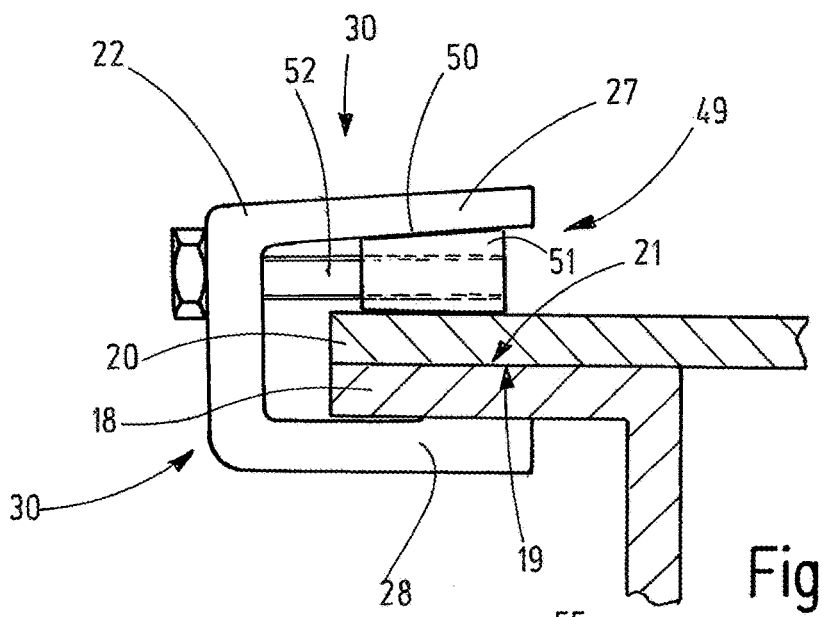
Figure 12:
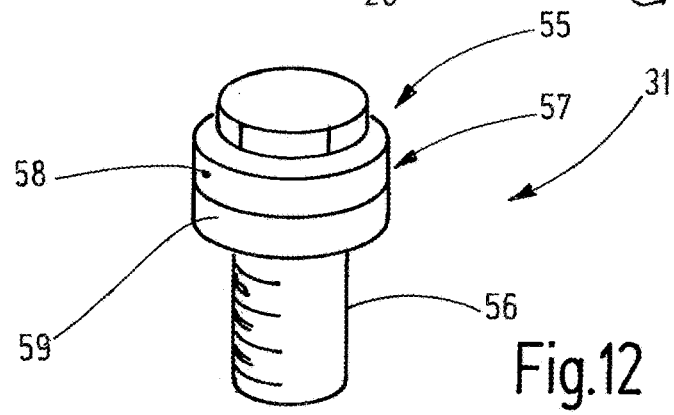

As a further alternative, a wedge clamping device 49 according to FIG. 11 can serve as clamping means 30 for the clamp 22. For this one of the legs 27 or 28 can be provided with a wedge surface 50 that extends in an acute angle relative to the flange surface 19 and the edge surface 21. Between this wedge surface 50 and the edge 20 or the flange 18 a wedge 51 is provided that can be tightened by means of the clamping means, e.g. a screw 52 that operates in a pulling manner.

The clamping means 30, according to FIG. 8, 9, 10 or 11, can be provided alternatively to the clamping screw 31 in the clamps according to FIGS. 2-6 and in all of the embodiments described in context therewith.

As an option it is possible to align the cover 17 relative to the flange 18 by positioning means 53, 54 for achieving a congruent alignment with the flange 18. For this one or more structures can be provided on the flange 18 that define the position of the cover 17, if it contacts the flange within the plane defined by the flange 18. Such positioning means can be one, (preferably) two or more alignment pins that are, for example, provided on the flange 18 and extend through the edge 20 at respective alignment bores. An inverse arrangement is possible.

In a preferred embodiment a force limitation means is provided for creation of the clamping force with which the edge 20 is pressed against the flange 18. For this the clamping screw 31 can comprise a torque limitation device 57 between its head 55 and its shank 56 that can be configured as friction clutch or ratchet, for example. For example the coupling half 58 assigned to the head and the coupling half 59 connected with the shank 56 in a torque-proof manner can be provided with a toothing on the sides facing each other respectively, wherein the two coupling halves 58, 59 are tensioned toward each other by suitable tensioning means, e.g. a spring. The toothing can be a saw tooth with different tooth flank inclinations with reference to the two rotation directions. In doing so, the torque can be limited, for example in tightening direction, whereas it can be unlimited in releasing direction. The tooth flanks that are effective in releasing direction are then, for example, steeply arranged, whereas the tooth flanks that are in engagement in tightening direction have a defined smaller inclination.

The inventive housing of the protection type flameproof enclosure comprises a housing body 15 that has an opening 16 closed by a cover 17. The opening 16 is bordered by a flange 18 that projects away from the housing body 15 outwardly. An edge 20 of the cover 17 is placed on the flange 18 in a flat manner with or without compression seal. Both the edge 20 and the flange 18 are preferably configured in a non-interrupted manner. In any case, they do not comprise through-openings for clamping means. For clamping the edge 20 against the flange 18, clamps 22 are provided that keep the edge 20 and the flange 18 pressed against each other in the type of screw clamps. The clamps 22 are provided with releasable clamping means 30 and are preferably captively retained on the housing body 15 or the cover 17, wherein they are movable between a closing position in which the cover 17 is clamped and an opening position in which they do not extend over the cover 17 and allow opening thereof in an unimpeded manner.

LIST OF REFERENCE SIGNS 14 housing
15 housing body
16 opening
17 cover
18 flange
19 flange surface
20 edge of the cover
21 edge surface
22 clamps 22a, 22b etc.
23 upper hinge
24 lower hinge
25 pivot axis
26 body
27 upper leg
28 lower leg
29 clamping surface
30 clamping means
31 clamping screw
32 foot
33 hinge
34 hinge axis
35 pin
36 holder
L center axis
37 abutment surface
38 elongated hole
39 pin
40 hinge
41 clamping screw
42 clamping lever
43 pivot axis
44 hinge axis
45 straight connecting line
46 contact location
47 eccentric clamping device
48 cam surface
49 wedge clamping device
50 wedge surface
51 wedge
52 screw
53 first positioning means
54 second positioning means
55 head of clamping screw 31
56 shank 56 of clamping screw 31
57 torque limitation device
58 head side coupling half
59 shank side coupling half

The invention claimed is:

1. A flameproof housing for housing electric or electronic components that could form ignition sources, comprising:
a housing body surrounding an inner space, the housing body including an opening bordered by a flange,
a cover that comprises an edge abutting against the flange,
a plurality of holders each connected to the flange, and
a plurality of clamps arranged along the flange and the edge with a distance to each other, each clamp of the plurality of clamps being movable between an open position in which it does not clasp the edge and a closing position in which it clasps the edge, wherein each clamp of the plurality of clamps frictionally engages a clamping surface of a respective one of the plurality of holders such that each clamp is retained in the open position such that the cover can be moved away from the flange, the plurality of clamps clamping the edge and against the flange when in the closing position in order to clamp the edge against the flange with or without a seal arranged therebetween.

2. The flameproof housing according to claim 1, wherein the flange has a planar flange surface and the cover has a planar edge surface that can be brought contact with the planar flange surface directly or via a seal placed in between.

3. The flameproof housing according to claim 1, wherein the cover is connected with the housing body via at least one hinge.

4. The flameproof housing according to claim 1, wherein positioning means are provided on the housing body and the cover for congruent alignment of the edge and the flange with regard to each other.

5. The flameproof housing according to claim 4, wherein the positioning means comprise at least two pins arranged on the flange or the edge to which complementary openings are arranged on the respective other of the flange or the edge.

6. The flameproof housing according to claim 1, wherein the plurality of clamps are captively held on the housing body or the cover.

7. The flameproof housing according to claim 1, wherein the plurality of clamps are movably held on the housing body or the cover.

8. The flameproof housing according to claim 1, wherein the plurality of clamps are pivotably held about a pivot axis on the housing body or the cover.

9. The flameproof housing according to claim 8, wherein the pivot axis is orientated orthogonal to the flange and each clamp of the plurality of clamps can be shifted parallel or transverse to the pivot axis.

10. The flameproof housing according to claim 1, wherein each holder of the plurality of holders has an abutment surface that contacts a respective one of the plurality of clamps when the respective one of the plurality of clamps is in the closing position.

11. The flameproof housing according to claim 1, wherein each clamp of the plurality of clamps has a clamping surface extending below the flange or extending above the cover and a clamping means opposed thereto.

12. The flameproof housing according to claim 11, wherein the clamping means is a clamping screw configured to neither extend through the edge, nor through the flange.

13. The flameproof housing according to claim 11, wherein the clamping means is selected from the group comprising; a clamping screw, a clamping wedge, an eccentric clamping device, and a clamping means with a force limitation device.

14. The flameproof housing according to claim 13, wherein the clamping means is a clamping screw with a torque limitation device.

15. The flameproof housing according to claim 2, wherein the cover is connected with the housing body via at least one hinge.

16. The flameproof housing according to claim 15, wherein positioning means are provided on the housing body and the cover for congruent alignment of the edge and the flange with regard to each other.

17. The flameproof housing according to claim 16, wherein the positioning means comprise at least two pins arranged on the flange or the edge to which complementary openings are arranged on the respective other of the flange or the edge.

18. The flameproof housing according to claim 17, wherein the plurality of clamps are captively held on the housing body or the cover.

19. The flameproof housing according to claim 1, wherein each one of the plurality of clamps has two legs extending away from a body portion and the body portion contacts the clamping surface when each one of the plurality of clamps is in the open position.

20. The flameproof housing according to claim 10, wherein each one of the plurality of clamps has two legs extending away from a body portion and the body portion contacts the abutment surface when each one of the plurality of clamps is in the closing position.

* * * * *